(12) United States Patent
Kim et al.

(10) Patent No.: US 11,393,676 B2
(45) Date of Patent: Jul. 19, 2022

(54) COMPOSITION FOR DEPOSITING SILICON-CONTAINING THIN FILM CONTAINING BIS(AMINOSILYL)ALKYLAMINE COMPOUND AND METHOD FOR MANUFACTURING SILICON-CONTAINING THIN FILM USING THE SAME

(71) Applicant: DNF CO., LTD., Daejeon (KR)

(72) Inventors: Sung Gi Kim, Daejeon (KR); Jeong Joo Park, Daejeon (KR); Joong Jin Park, Daejeon (KR); Se Jin Jang, Jeju-si (KR); Byeong-Il Yang, Daejeon (KR); Sang-Do Lee, Daejeon (KR); Sam Dong Lee, Daejeon (KR); Sang Ick Lee, Daejeon (KR); Myong Woon Kim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 194 days.

(21) Appl. No.: 16/499,215

(22) PCT Filed: Mar. 28, 2018

(86) PCT No.: PCT/KR2018/003655
§ 371 (c)(1),
(2) Date: Sep. 27, 2019

(87) PCT Pub. No.: WO2018/182309
PCT Pub. Date: Oct. 4, 2018

(65) Prior Publication Data
US 2020/0111664 A1  Apr. 9, 2020

(30) Foreign Application Priority Data

Mar. 29, 2017  (KR) .................. 10-2017-0040078
Apr. 28, 2017  (KR) .................. 10-2017-0055632
Mar. 27, 2018  (KR) .................. 10-2018-0035010

(51) Int. Cl.
*H01L 21/31*  (2006.01)
*H01L 21/02*  (2006.01)
(Continued)

(52) U.S. Cl.
CPC ...... *H01L 21/02208* (2013.01); *C01B 21/068* (2013.01); *C01B 33/183* (2013.01);
(Continued)

(58) Field of Classification Search
CPC ......... H01L 21/02208; H01L 21/02126; H01L 21/0214; H01L 21/02164; H01L 21/02167;
(Continued)

(56) References Cited

U.S. PATENT DOCUMENTS

2009/0095346 A1  4/2009  Hurley et al.
2014/0287164 A1*  9/2014  Xiao .................. C07F 7/0896
                                                          427/579
2016/0280724 A1  9/2016  Arkles et al.

FOREIGN PATENT DOCUMENTS

CN  103401019 A  11/2013
CN  105377860 A  3/2016
(Continued)

OTHER PUBLICATIONS

Freza, S. et al., "Influence of substituents in vinyl groups on reactivity of parylene during polymerization process," Chemical Physics, vol. 368, No. 3, Mar. 11, 2010, Available Online Jan. 28, 2010, 7 pages.
(Continued)

*Primary Examiner* — Brook Kebede
(74) *Attorney, Agent, or Firm* — McCoy Russell LLP

(57) ABSTRACT

Provided are a composition for depositing a silicon-containing thin film containing a bis(aminosilyl)alkylamine com-
(Continued)

pound and a method for manufacturing a silicon-containing thin film using the same, and more particularly, a composition for depositing a silicon-containing thin film, containing the bis(aminosilyl)alkylamine compound capable of being usefully used as a precursor of the silicon-containing thin film, and a method for manufacturing a silicon-containing thin film using the same.

14 Claims, 2 Drawing Sheets

(51) Int. Cl.
| | |
|---|---|
| *C23C 16/32* | (2006.01) |
| *C01B 33/18* | (2006.01) |
| *C01B 21/068* | (2006.01) |
| *C07F 7/10* | (2006.01) |
| *C23C 16/455* | (2006.01) |
| *C23C 16/50* | (2006.01) |
| *C23C 16/40* | (2006.01) |
| *C23C 16/34* | (2006.01) |
| *C23C 16/30* | (2006.01) |
| *C23C 16/36* | (2006.01) |
| *C09D 1/00* | (2006.01) |

(52) U.S. Cl.
CPC .................. *C07F 7/10* (2013.01); *C09D 1/00* (2013.01); *C23C 16/308* (2013.01); *C23C 16/325* (2013.01); *C23C 16/345* (2013.01); *C23C 16/36* (2013.01); *C23C 16/401* (2013.01); *C23C 16/4554* (2013.01); *C23C 16/50* (2013.01); *H01L 21/0214* (2013.01); *H01L 21/0217* (2013.01); *H01L 21/0228* (2013.01); *H01L 21/02126* (2013.01); *H01L 21/02164* (2013.01); *H01L 21/02167* (2013.01); *H01L 21/02271* (2013.01); *H01L 21/02274* (2013.01)

(58) Field of Classification Search
CPC ........... H01L 21/0217; H01L 21/02271; H01L 21/02274; H01L 21/0228; C23C 16/308; C23C 16/325; C23C 16/345; C23C 16/36; C23C 16/401; C23C 16/4554; C23C 16/50; C01B 21/068; C01B 33/183; C07F 7/10; C09D 1/00
USPC .......................................................... 438/778
See application file for complete search history.

(56) References Cited

FOREIGN PATENT DOCUMENTS

| EP | 2669249 A1 * | 12/2013 | ....... C23C 16/45553 |
|---|---|---|---|
| JP | 2008074847 A | 4/2008 | |
| JP | 2014523638 A | 9/2014 | |
| JP | 2014237644 A | 12/2014 | |
| KR | 20140143682 A | 12/2014 | |
| WO | WO-2008038255 A1 * | 4/2008 | ................ C07F 7/10 |
| WO | 2014196827 A2 | 12/2014 | |
| WO | 2016049154 A1 | 3/2016 | |

OTHER PUBLICATIONS

ISA Korean Intellectual Property Office, International Search Report Issued in Application No. PCT/KR2018/003655, dated Jul. 13, 2018, WIPO, 2 pages.
State Intellectual Property Office of the People's Republic of China, Office Action and Search Report Issued in Application No. 201880019422.X, dated Nov. 13, 2020, 13 pages. (Submitted with Partial Translation).
Japanese Patent Office, Office Action Issued in Application No. 2019-553053, dated Nov. 27, 2020, 9 pages.
United States Patent and Trademark Office, Office Action Issued in U.S. Appl. No. 16/499,196, dated May 24, 2021, 19 pages.
"CAS No. 23636-57-9," ichemistry Website, Available Online at http://www.ichemistry.cn/chemistry/23636-57-9.htm. Retrieved on Dec. 1, 2021, 3 pages. (See NPL 1, Office Action Issued in U.S. Appl. No. 16/499,196 for Explanation of Relevancy).

* cited by examiner

[FIG. 1]
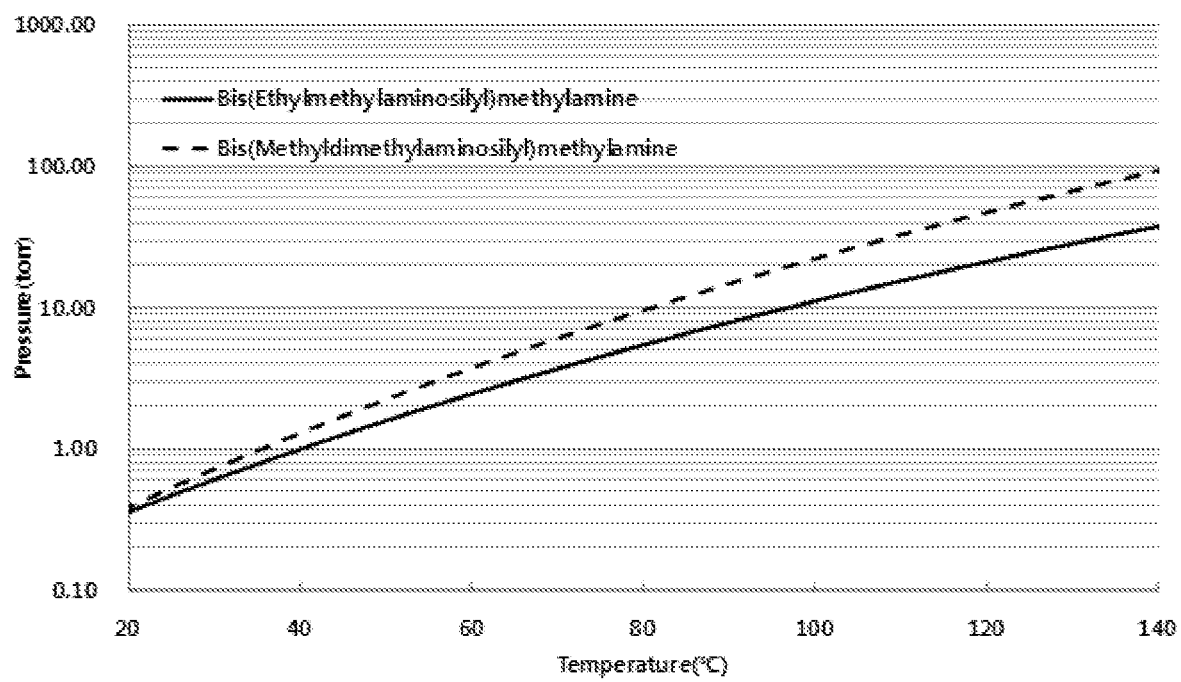
[FIG. 2]
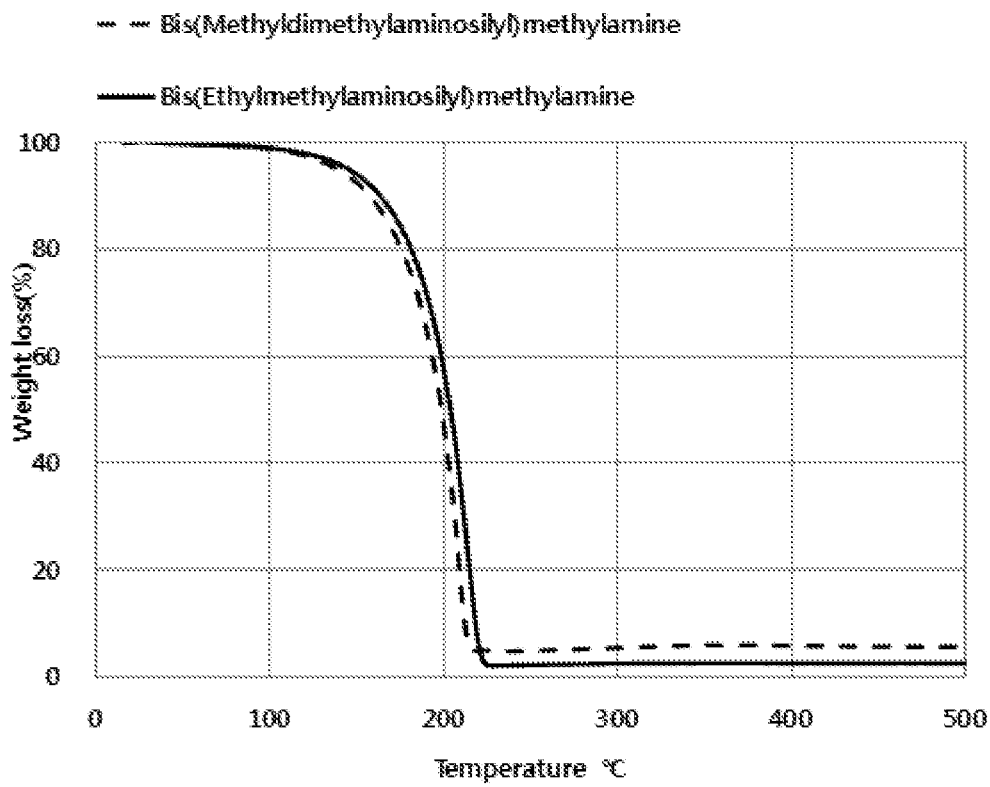

[FIG. 3]
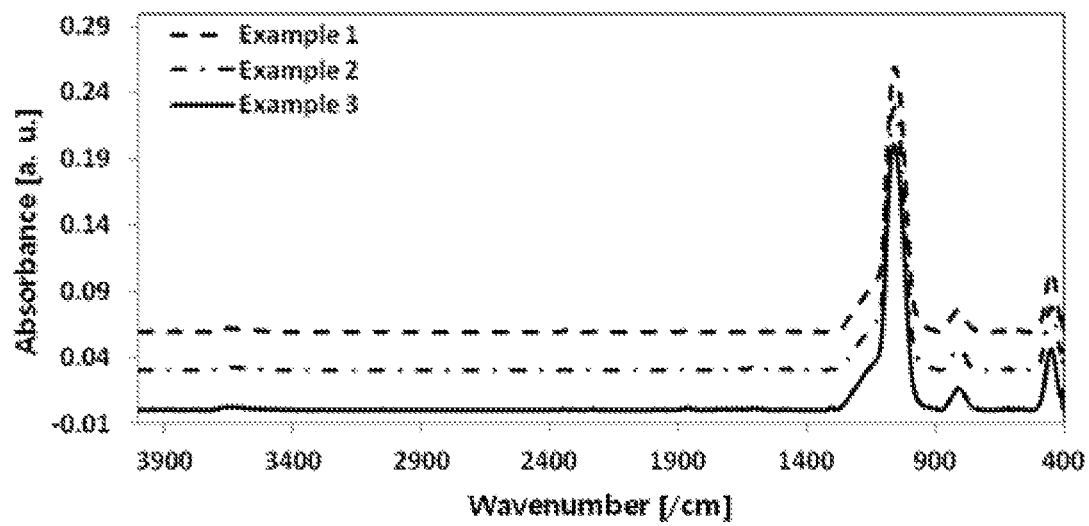
[FIG. 4]
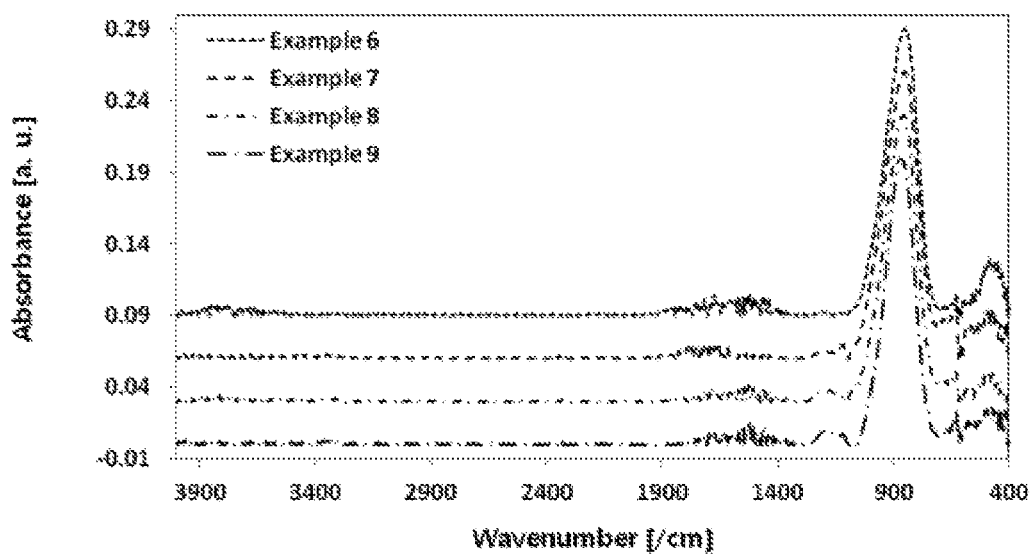

COMPOSITION FOR DEPOSITING SILICON-CONTAINING THIN FILM CONTAINING BIS(AMINOSILYL)ALKYLAMINE COMPOUND AND METHOD FOR MANUFACTURING SILICON-CONTAINING THIN FILM USING THE SAME

CROSS-REFERENCE TO RELATED APPLICATIONS

The present application is a U.S. National Phase of International Patent Application Serial No. PCT/KR2018/003655 entitled "COMPOSITION FOR DEPOSITING SILICON-CONTAINING THIN FILM CONTAINING BIS (AMINOSILYL)ALKYLAMINE COMPOUND AND METHOD FOR MANUFACTURING SILICON-CONTAINING THIN FILM USING THE SAME," filed on Mar. 28, 2018. International Patent Application Serial No. PCT/KR2018/003655 claims priority to Korean Patent Application No. 10-2017-0040078 filed on Mar. 29, 2017 and Korean Patent Application No. 10-2017-0055632 filed on Apr. 28, 2017 and Korean Patent Application No. 10-2018-0035010 filed on Mar. 27, 2018. The entire contents of each of the above-referenced applications are hereby incorporated by reference for all purposes.

TECHNICAL FIELD

The present invention relates to a composition for depositing a silicon-containing thin film and a method for manufacturing a silicon-containing thin film using the same, and more particularly, to a composition for depositing a silicon-containing thin film, containing a specific compound, a bis(aminosilyl)alkylamine compound as a precursor for depositing a thin film, and a method for manufacturing a silicon-containing thin film using the same.

BACKGROUND ART

A silicon-containing thin film is manufactured through various deposition processes in a semiconductor field to thereby be manufactured in various forms such as a silicon film, a silicon oxide film, a silicon nitride film, a silicon carbonitride film, and a silicon oxynitride film, and an application field of the silicon-containing thin film may be wide.

Particularly, since the silicon oxide film and the silicon nitride film have a significantly excellent barrier property and oxidation resistance, the silicon oxide film and the silicon nitride film are used as an insulating film, a diffusion barrier, a hard mask, an etch stop layer, a seed layer, a spacer, a trench isolation, an intermetallic dielectric material, and a passivation layer in manufacturing an apparatus.

Recently, a polycrystalline silicon thin film has been used in a thin film transistor (TFT), a solar cell, and the like, and an application field thereof has been gradually diversified.

As a representative technology for manufacturing a silicon-containing thin film known in the art, there are a metal-organic chemical vapor deposition (MOCVD) method for reacting a gas-type silicon precursor and a reaction gas with each other to form a film on a surface of a substrate or directly reacting the gas-type silicon precursor and the reaction gas with each other on the surface to form a film and an atomic layer deposition (ALD) method for physically or chemically adsorbing a gas-type silicon precursor and sequentially injecting a reaction gas to form a film. Various technologies for manufacturing a thin film such as a low-pressure chemical vapor deposition (LPCVD) method applying the above-mentioned method, a plasma-enhanced chemical vapor deposition (PECVD) method and a plasma-enhanced atomic layer deposition (PEALD) method capable of performing deposition at a low temperature, and the like, are applied to processes for manufacturing next-generation semiconductors and display devices to thereby be used to form a ultra-fine pattern and deposit an ultra-thin film having uniform and excellent properties at a nano-scale thickness.

Representative examples of a precursor used to form the silicon-containing thin film may include silane, silane compounds, aminosilane, and alkoxysilane compounds. Specific examples thereof may include silane chloride compounds such as dichlorosilane ($SiH_2Cl_2$) and hexachlorodisilane ($Cl_3SiSiCl_3$), trisilylamine ($N(SiH_3)_3$), bis-diethylaminosilane ($H_2Si(N(CH_2CH_3)_2)_2$), di-isopropylaminosilane ($H_3SiN(i-C_3H_7)_2$), and the like. These precursors have been used in mass-production processes for manufacturing semiconductors and displays.

However, due to fineness of devices caused by ultra-high integration of the devices and an increase in aspect ratio, and diversification of materials of the devices, a technology of forming an ultra-fin thin film having a uniform and thin thickness and excellent electrical properties at a low temperature to be desired has been required. Therefore, a high-temperature process (600° C. or more) using an existing silicon precursor, a step coverage, etching properties, and physical and electric properties of the thin film have become problems, such that the development of a novel more excellent silicon precursor and a method for forming a thin film have been studied.

Technical Problem

An object of the present invention is to provide a composition for depositing a silicon-containing thin film, containing a bis(aminosilyl)alkylamine compound capable of being used as a precursor of the silicon-containing thin film.

Another object of the present invention is to provide a method for manufacturing a silicon-containing thin film using the composition for depositing a silicon-containing thin film according to the present invention.

Another object of the present invention is to provide a bis(aminosilyl)alkylamine compound capable of being used as a precursor of a silicon-containing thin film.

Technical Solution

In one general aspect, there is provided a composition for depositing a silicon-containing thin film containing: a bis (aminosilyl)alkylamine compound, which has excellent physical properties as a precursor for thin film deposition, as a precursor for silicon-containing thin film deposition, wherein the bis(aminosilyl)alkylamine compound is represented by the following Chemical Formula 1.

[Chemical Formula 1]

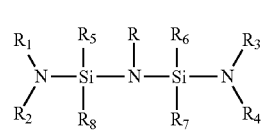

(In Chemical Formula 1, R is (C1-C7)alkyl or (C2-C7) alkenyl; $R_1$ to $R_4$ are each independently hydrogen, (C1-C7)

alkyl, or (C2-C7)alkenyl, or $R_1$ and $R_2$, and $R_3$ and $R_4$ are each independently linked to each other to form a ring; and $R_5$ to $R_8$ are each independently hydrogen, halogen, (C1-C7)alkyl, or (C2-C7)alkenyl.)

Preferably, in Chemical Formula 1 according to an exemplary embodiment of the present invention, $R_5$ to $R_7$ may be each independently hydrogen, halogen, (C1-C7)alkyl, or (C2-C7)alkenyl, and $R_8$ may be hydrogen.

In order to allow the composition to have excellent properties suitable for thin film deposition, it is preferable that the bis(aminosilyl)alkylamine compound according to the exemplary embodiment of the present invention may be represented by the following Chemical Formula 2 or 3.

[Chemical Formula 2]

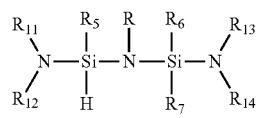

[Chemical Formula 3]

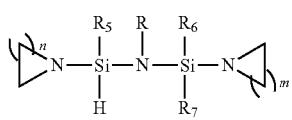

(In Chemical Formula 2 or 3, R is (C1-C7)alkyl or (C2-C7)alkenyl; $R_5$ to $R_7$ are each independently hydrogen, halogen, (C1-C7)alkyl, or (C2-C7)alkenyl; $R_{11}$ to $R_{14}$ are each independently hydrogen, (C1-C5)alkyl, or (C2-C5)alkenyl; and n and m are each independently an integer of 1 to 7.)

Preferably, in Chemical Formula 2 or 3 according to the exemplary embodiment of the present invention, $R_5$ to $R_7$ may be each independently hydrogen or (C1-C5)alkyl; $R_{11}$ to $R_{14}$ may be each independently hydrogen, (C1-C5)alkyl, or (C2-C5)alkenyl; and n and m may be each independently an integer of 1 to 4.

Preferably, the bis(aminosilyl)alkylamine compound represented by Chemical Formula 1 according to the exemplary embodiment of the present invention may be represented by the following Chemical Formula 4 or 5.

[Chemical Formula 4]

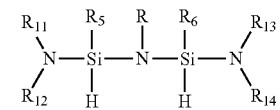

[Chemical Formula 5]

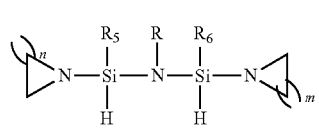

(In Chemical Formulas 4 and 5, R is (C1-C7)alkyl or (C2-C7)alkenyl; $R_{11}$ to $R_{14}$ are each independently hydrogen, (C1-C7)alkyl, or (C2-C7)alkenyl; $R_5$ and $R_6$ are each independently (C1-C7)alkyl, or (C2-C7)alkenyl; and n and m are each independently an integer of 1 to 7.)

Preferably, in Chemical Formula 4 or 5 according to the exemplary embodiment of the present invention, R may be (C1-C5)alkyl; $R_5$ and $R_6$ may be each independently (C1-C5)alkyl; and n and m may be each independently an integer of 1 to 4.

Preferably, the bis(aminosilyl)alkylamine compound represented by Chemical Formula 1 according to the exemplary embodiment of the present invention may be represented by the following Chemical Formula 6 or 7.

[Chemical Formula 6]

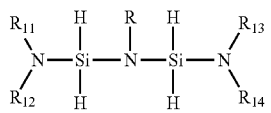

[Chemical Formula 7]

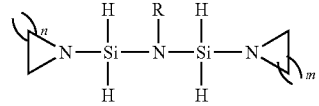

(In Chemical Formulas 6 and 7, R is (C1-C7)alkyl or (C2-C7)alkenyl; $R_{11}$ to $R_{14}$ are each independently hydrogen, (C1-C7)alkyl, or (C2-C7)alkenyl; and n and m are each independently an integer of 1 to 7.)

Preferably, in Chemical Formula 6 or 7 according to the exemplary embodiment of the present invention, R may be (C1-C5)alkyl; $R_{11}$ to $R_{14}$ may be each independently hydrogen, (C1-C5)alkyl, or (C2-C5)alkenyl; and n and m may be each independently an integer of 1 to 4.

The bis(aminosilyl)alkylamine compound according to the exemplary embodiment of the present invention may be selected from the following compounds, but is not limited thereto.

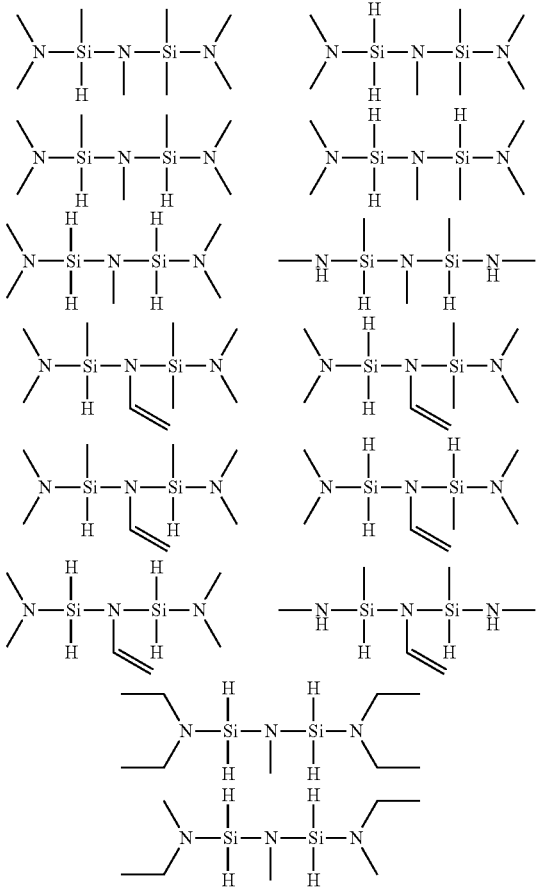

-continued

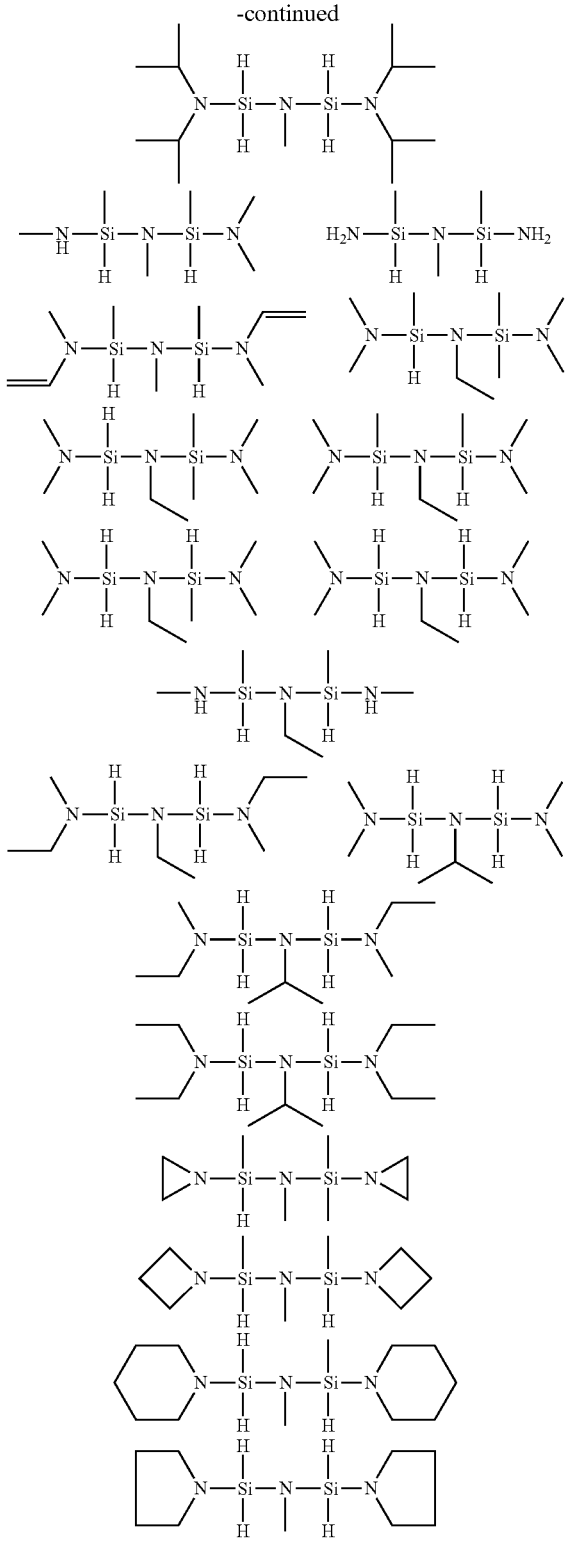

In another general aspect, there is provided a method for manufacturing a silicon-containing thin film using the composition for depositing a silicon-containing thin film described above.

The composition for depositing a silicon-containing thin film may be deposited by an atomic layer deposition (ALD) method, a chemical vapor deposition (CVD) method, a metal-organic chemical vapor deposition (MOCVD) method, a low-pressure chemical vapor deposition (LPCVD) method, a plasma-enhanced chemical vapor deposition (PECVD) method, or a plasma-enhanced atomic layer deposition (PEALD) method, and the silicon-containing thin film may be a silicon oxide ($SiO_2$) film, a silicon oxy carbide (SiOC) film, a silicon nitride (SiN) film, a silicon oxy nitride (SiON) film, a silicon carbonitride (SiCN) film, or a silicon carbide (SiC) film.

More specifically, the method for manufacturing a silicon-containing thin film may include:

a. maintaining a temperature of a substrate mounted in a chamber at 30 to 500° C.;

b. contacting the composition for depositing a silicon-containing thin film described above with the substrate to adsorb the composition for depositing a silicon-containing thin film in the substrate; and c. injecting a reaction gas into the substrate in which the composition for depositing a silicon-containing thin film is adsorbed to form a silicon-containing thin film, wherein the reaction gas is supplied after being activated by generating plasma with a plasma power of 50 to 1000 W.

In another general aspect, there is provided a bis(aminosilyl)alkylamine compound represented by Chemical Formula 1 described above.

In order to more efficiently deposit a high-quality thin film, the bis(aminosilyl)alkylamine compound represented by Chemical Formula 1 may be represented by Chemical Formula 2 or 3.

Advantageous Effects

A composition for depositing a silicon-containing thin film contains a bis(aminosilyl)alkylamine compound which is a liquid at room temperate and has high volatility and excellent thermal stability as a precursor, such that a high-quality silicon-containing thin film having a high purity and durability may be provided under lower plasma power and film formation temperature conditions.

Further, in a method for manufacturing a silicon-containing thin film using the composition for depositing a silicon-containing thin film according to the present invention, excellent thermal stability and deposition rate, and excellent stress intensity may be implemented even under a low film formation temperature condition, and in a silicon-containing thin film manufactured thereby, contents of impurities such as carbon, oxygen, and hydrogen are minimized, thereby making it possible to manufacture a silicon-containing thin film having a high purity, excellent physical and electrical properties, excellent resistance against hydrogen fluoride, an excellent water vapor transmission rate, and an excellent step coverage.

BRIEF DESCRIPTION OF THE FIGURES

FIG. 1 is a view illustrating a result obtained by measuring vapor pressures of bis(aminosilyl)alkylamine compounds prepared in Examples 1 and 2.

FIG. 2 is a view illustrating results obtained by performing thermogravimetric analysis on the bis(aminosilyl)alkylamine compounds prepared in Examples 1 and 2.

FIG. 3 is a view illustrating results obtained by performing infrared spectroscopic analysis on deposited films of silicon oxide thin films manufactured in Examples 3 to 5.

FIG. 4 is a view illustrating results obtained by performing infrared spectroscopic analysis on deposited films of silicon nitride thin films manufactured in Examples 6 to 9.

DETAILED DESCRIPTION

Best Mode

The present invention provides a composition for depositing a silicon-containing thin film containing a bis(aminosilyl)alkylamine compound, which is a liquid at room temperature and has high volatility and excellent thermal stability to thereby be used as a useful precursor for forming a silicon-containing thin film, wherein the bis(aminosilyl)alkylamine compound is represented by the following Chemical Formula 1.

[Chemical Formula 1]

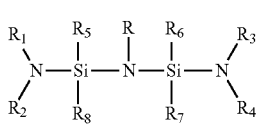

(In Chemical Formula 1, R is (C1-C7)alkyl or (C2-C7)alkenyl; $R_1$ to $R_4$ are each independently hydrogen, (C1-C7)alkyl, or (C2-C7)alkenyl, or $R_1$ and $R_2$, and $R_3$ and $R_4$ are each independently linked to each other to form a ring; and $R_5$ to $R_8$ are each independently hydrogen, halogen, (C1-C7)alkyl, or (C2-C7)alkenyl.)

The composition for depositing a silicon-containing thin film according to the present invention contains a precursor for depositing a thin film represented by Chemical Formula 1, such that film formation may be performed at a low temperature, and at the same time, a high-quality thin film having high durability may be easily manufactured.

Further, the composition for depositing a silicon-containing thin film according to the present invention contains the precursor for depositing a thin film represented by Chemical Formula 1, the thin film may be deposited at a high thin film deposition rate, and the film has excellent stress properties and water vapor transmission rate.

The reason may be that as the bis(aminosilyl)alkylamine compound represented by Chemical Formula 1, contained in the composition for depositing a silicon-containing thin film has two aminosilyl groups and one alkyl or alkenyl group as substituents, the bis(aminosilyl)alkylamine compound has high volatility and excellent thermal stability.

Preferably, in Chemical Formula 1 according to the exemplary embodiment, $R_5$ to $R_7$ may be each independently hydrogen, halogen, (C1-C7)alkyl, or (C2-C7)alkenyl, and $R_8$ may be hydrogen.

Preferably, the bis(aminosilyl)alkylamine compound represented by Chemical Formula 1 according to an exemplary embodiment of the present invention may be represented by the following Chemical Formula 2 or 3.

[Chemical Formula 2]

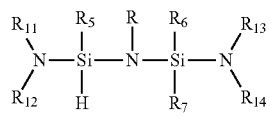

[Chemical Formula 3]

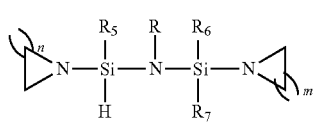

(In Chemical Formula 2 or 3, R is (C1-C7)alkyl or (C2-C7)alkenyl; $R_5$ to $R_7$ are each independently hydrogen, halogen, (C1-C7)alkyl, or (C2-C7)alkenyl; $R_{11}$ to $R_{14}$ are each independently hydrogen, (C1-C5)alkyl, or (C2-C5)alkenyl; and n and m are each independently an integer of 1 to 7.)

In the bis(aminosilyl)alkylamine compound represented by Chemical Formula 2 or 3 according to the present invention, two aminosilyl functional groups and one alkyl or alkenyl group are substituted, such that the bis(aminosilyl)alkylamine compound is thermally stable, and at the same time, the bis(aminosilyl)alkylamine compound has a silazane backbone in which at least one hydrogen atom in at least one of two aminosilyl functional groups is substituted, such that the bis(aminosilyl)alkylamine compound has high volatility as a liquid at room temperature. Therefore, the bis(aminosilyl)alkylamine compound may be significantly usefully used to form a silicon-containing thin film.

More specifically, the bis(aminosilyl)alkylamine compound according to the present invention, which is a compound having the silazane backbone, essentially has two aminosilyl functional groups

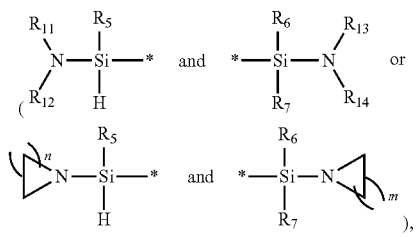

and silyl in one of the aminosilyl functional groups necessarily has a functional group containing at least one hydrogen atom

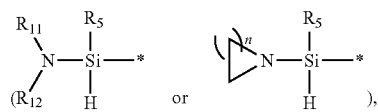

such that the bis(aminosilyl)alkylamine compound may have excellent effects as the precursor for depositing a thin film.

Preferably, in Chemical Formula 2 or 3 according to the exemplary embodiment of the present invention, $R_5$ to $R_7$ may be each independently hydrogen or (C1-C5)alkyl; $R_{11}$ to $R_{14}$ may be each independently hydrogen, (C1-C5)alkyl, or (C2-C5)alkenyl; and n and m may be each independently an integer of 1 to 4.

More preferably, the bis(aminosilyl)alkylamine compound represented by Chemical Formula 1 according to the present invention may be represented by the following Chemical Formula 4 or 5.

[Chemical Formula 4]

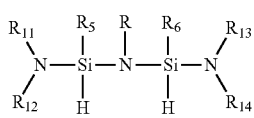

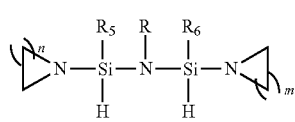

[Chemical Formula 5]

(In Chemical Formulas 4 and 5, R is (C1-C7)alkyl or (C2-C7)alkenyl; $R_{11}$ to $R_{14}$ are each independently hydrogen, (C1-C7)alkyl, or (C2-C7)alkenyl; and $R_5$ and $R_6$ are each independently (C1-C7)alkyl, or (C2-C7)alkenyl; and n and m are each independently an integer of 1 to 7.)

Preferably, in Chemical Formulas 4 and 5 according to the exemplary embodiment of the present invention, R may be (C1-C5)alkyl; $R_5$ and $R_6$ may be each independently (C1-C5)alkyl; and n and m may be each independently an integer of 1 to 4. More preferably, the bis(aminosilyl)alkylamine compound may be represented by Chemical Formula 4, and in Chemical Formula 4, R may be (C1-C3)alkyl; and $R_5$ and $R_6$ may be each independently (C1-C3)alkyl.

Preferably, the bis(aminosilyl)alkylamine compound represented by Chemical Formula 1 according to the exemplary embodiment of the present invention may be represented by the following Chemical Formula 6 or 7.

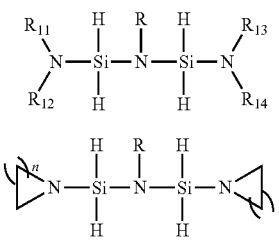

[Chemical Formula 6]

[Chemical Formula 7]

(In Chemical Formulas 6 and 7, R is (C1-C7)alkyl or (C2-C7)alkenyl; $R_{11}$ to $R_{14}$ are each independently hydrogen, (C1-C7)alkyl, or (C2-C7)alkenyl; and n and m are each independently an integer of 1 to 7.)

More preferably, in Chemical Formulas 6 and 7, R may be (C1-C5)alkyl; $R_{11}$ to $R_{14}$ may be each independently hydrogen, (C1-C5)alkyl, or (C2-C5)alkenyl; n and m may be each independently an integer of 1 to 4. Preferably, R may be (C1-C5)alkyl; $R_{11}$ to $R_{14}$ may be each independently (C1-C5)alkyl; and n and m may be each independently 1 to 4. More preferably, the bis(aminosilyl)alkylamine compound may be represented by Chemical Formula 6, wherein in Chemical Formula 6, R may be (C1-C3)alkyl; and $R_{11}$ to $R_{14}$ may be each independently (C1-C3)alkyl.

When silyl groups of two aminosilyl groups in the silazane backbone of the bis(aminosilyl)alkylamine compound according to the present invention have two or four hydrogen atoms, the bis(aminosilyl)alkylamine compound has more excellent reactivity and thermal stability as the precursor for depositing a thin film, such that a higher-quality thin film may be manufactured.

In view of the precursor for depositing a thin film having more excellent properties, the bis(aminosilyl)alkylamine compound represented by Chemical Formula 4 according to the exemplary embodiment of the present invention may be represented by the following Chemical Formula 4-1.

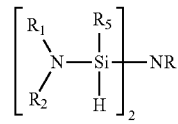

[Chemical Formula 4-1]

(In Chemical Formula 4-1, R is (C1-C7)alkyl or (C2-C7)alkenyl; $R_1$ and $R_2$ are each independently hydrogen, (C1-C7)alkyl, or (C2-C7)alkenyl, or $R_1$ and $R_2$ is each independently linked to each other to form a ring; and $R_5$ is (C1-C7)alkyl or (C2-C7)alkenyl.)

In view of the precursor for depositing a thin film having more excellent properties, the bis(aminosilyl)alkylamine compound represented by Chemical Formula 6 according to the exemplary embodiment of the present invention may be represented by the following Chemical Formula 6-1.

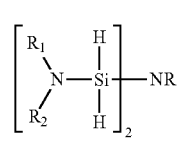

[Chemical Formula 6-1]

(In Chemical Formula 6-1, R is (C1-C7)alkyl or (C2-C7)alkenyl; and $R_1$ and $R_2$ are each independently (C1-C7)alkyl, or (C2-C7)alkenyl, or are linked to each other to form a ring.)

Although not limited, but a specific example of the bis(aminosilyl)alkylamine compound represented by Chemical Formula 1 according to the exemplary embodiment of the present invention may include the following compounds.

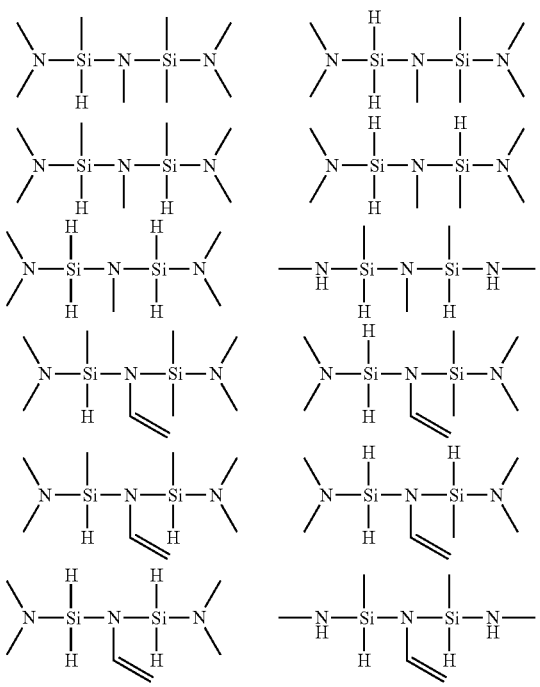

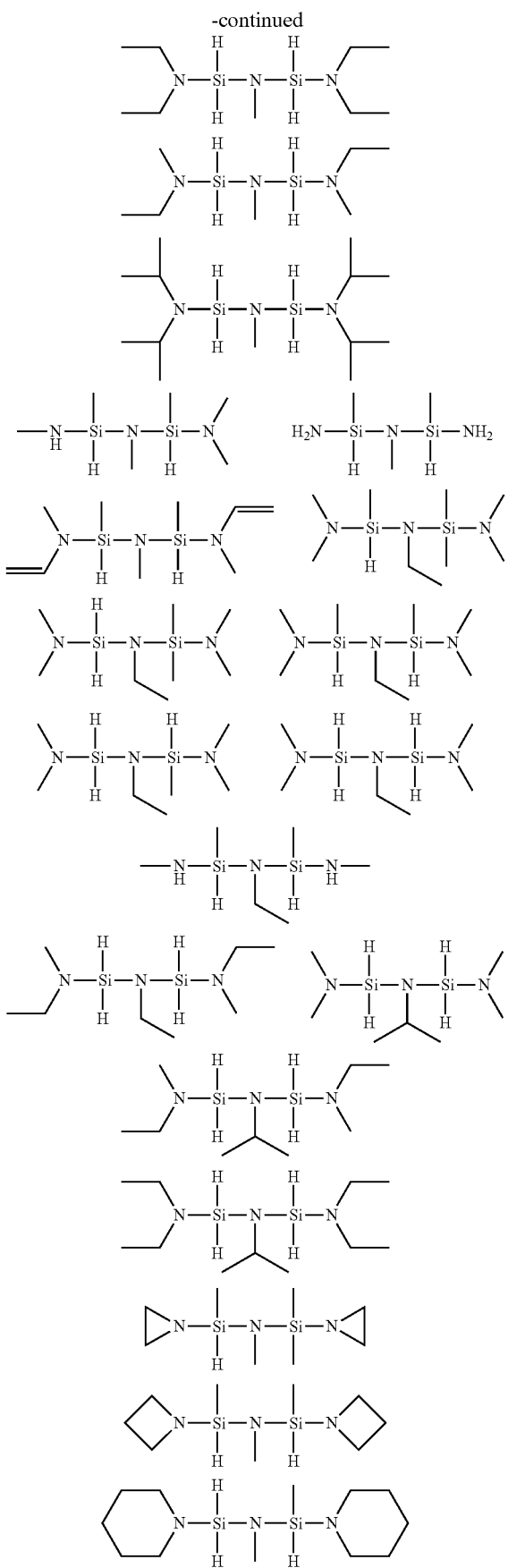

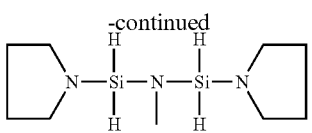

The composition for depositing a silicon-containing thin film according to the present invention needs to necessarily contain the bis(aminosilyl)alkylamine compound represented by Chemical Formula 1 as the precursor for depositing a thin film, and the bis(aminosilyl)alkylamine compound may be contained in the composition for depositing a silicon-containing thin film in a content range in which the content may be recognized by those skilled in the art in consideration of film formation conditions, a thickness, properties, or the like of the thin film.

As used herein, the term "alkyl" means linear, branched, and cyclic saturated and unsaturated hydrocarbons having 1 to 7 carbon atoms, preferably, 1 to 5 carbon atoms, and more preferably 1 to 3 carbon atoms, and examples thereof may include methyl, ethyl, propyl, isopropyl, butyl, isobutyl, neobutyl, pentyl, and the like.

As used herein, the term "halogen" means a halogen element, and examples thereof include fluoro, chloro, bromo, and iodo.

As used herein, the term "alkenyl" as a single group or a part of another group means a straight-chain, branched-chain, or cyclic hydrocarbon radical having 2 to 7 carbon atoms and one or more carbon-carbon double bonds. A more preferable alkenyl radical is a lower alkenyl radical having 2 to 5 carbon atoms. The most preferable lower alkenyl radical is a lower alkenyl radical having about 2 to 3 carbon atoms. Further, the alkenyl group may be substituted at a random usable attachment point. Examples of the alkenyl radical include ethenyl, propenyl, allyl, butenyl, and 4-methylbutenyl. The terms "alkenyl" and "lower alkenyl" include radicals having cis and trans orientations or alternatively, E and Z orientations.

As used herein, the phrase "$R_1$ and $R_2$, and $R_3$ and $R_4$ are each independently linked to each other to form a ring" includes the case in which $R_1$ and $R_2$ are linked to each other to form a ring but $R_3$ and $R_4$ do not form a ring; the case in which on the contrary, $R_1$ and $R_2$ do not form a ring but $R_3$ and $R_4$ are linked to each other to form a ring; and the case in which $R_1$ and $R_2$ are linked to each other to form a ring and $R_3$ and $R_4$ are linked to each other to form a ring, wherein the formed ring may be an alicyclic or aromatic ring containing N, and preferably, an alicyclic ring.

As used herein, the term "alicyclic ring" means a compound that is not an aromatic compound among organic compounds having a cyclic bonding structure.

The bis(aminosilyl)alkylamine compound represented by Chemical Formula 1 according to the present invention may be prepared using a method as long as the method may be recognized by those skilled in the art.

In addition, the present invention provides a method for manufacturing a silicon-containing thin film using the composition for depositing a silicon-containing thin film according to the present invention.

Since in the method for manufacturing a silicon-containing thin film, the composition for depositing a silicon-containing thin film according to the present invention, containing the bis(aminosilyl)alkylamine compound represented by Chemical Formula 1, which is a liquid art room temperature and normal pressure and has high volatility and excellent thermal stability, as the precursor is used, the handling may be easy, it is possible to manufacture various thin films, and it is possible to manufacture a silicon-containing thin film having a high purity, an excellent water vapor transmission rate, and excellent thin film stress properties at a high deposition rate even at a low temperature and a low power.

The silicon-containing thin film manufactured by the method according to the present invention has excellent durability and electric properties, and resistance against hydrogen fluoride and step coverage thereof are also excellent.

In the method for manufacturing a silicon-containing thin film according to the present invention, the silicon-containing thin film may be formed by any method as long as it may be recognized by those skilled in the art. However, preferably, the silicon-containing thin film may be formed by an atomic layer deposition (ALD) method, a chemical vapor deposition (CVD) method, a metal-organic chemical vapor deposition (MOCVD) method, a low-pressure chemical vapor deposition (LPCVD) method, a plasma enhanced chemical vapor deposition (PECVD) method, or a plasma enhanced atomic layer deposition (PEALD) method, but PECVD, ALD, or PEALD is more preferable in order to allow the thin film to be more easily deposited, and allow the manufactured thin film to have excellent properties.

The silicon-containing thin film according to the present invention may be a silicon oxide ($SiO_2$) film, a silicon oxy carbide (SiOC) film, a silicon nitride (SiN) film, a silicon oxy nitride (SiON) film, a silicon carbonitride (SiCN) film, or a silicon carbide (SiC) film, and various thin films having high quality, particularly, a thin film usable as an encapsulant of an organic light emitting diode (OLED), may be manufactured.

More specifically, the method for manufacturing a silicon-containing thin film according to the present invention may include:

a. maintaining a temperature of a substrate mounted in a chamber at 30 to 500° C.;
b. contacting the composition for depositing a silicon-containing thin film according to the present invention with the substrate to adsorb the composition for depositing a silicon-containing thin film in the substrate; and
c. injecting a reaction gas into the substrate in which the composition for depositing a silicon-containing thin film is adsorbed to form a silicon-containing thin film.

More specifically, the method for manufacturing a silicon-containing thin film according to the present invention may include:

a. maintaining a temperature of a substrate mounted in a chamber at 30 to 500° C.;
b. contacting the composition for depositing a silicon-containing thin film according to the present invention with the substrate to adsorb the composition for depositing a silicon-containing thin film in the substrate;
c. purging the remaining composition for depositing a silicon-containing thin film and by-products;
d. injecting a reaction gas into the substrate in which the composition for depositing a silicon-containing thin film is adsorbed to form a silicon-containing thin film; and
e. purging the remaining reaction gas and by-products, wherein the reaction gas in step D) may remove a ligand of the bis(aminosilyl)alkylamine compound contained in the composition for depositing a silicon-containing thin film to form a Si—O atomic layer.

Preferably, the reaction gas according to the exemplary embodiment of the present invention may be supplied after being activated by generating plasma at a plasma power of 50 to 1000 W.

In the method for manufacturing a silicon-containing thin film according to the exemplary embodiment of the present invention, a bis(aminosilyl)alkylamine compound according to the present invention is used as the precursor, such that the reaction gas may be activated at preferably 30 to 500° C., and more preferably 30 to 300° C. by generating plasma at a low plasma power of 50 to 1000 W, preferably 100 to 800 W, and more preferably 400 to 600 W, thereby making it possible to manufacture the thin film.

In the method for manufacturing a silicon-containing thin film according to the exemplary embodiment of the present invention, deposition conditions may be adjusted depending on a structure or thermal properties of a desired thin film. Examples of the deposition condition according to the exemplary embodiment of the present invention may include an injection flow rate of the composition for depositing a silicon-containing thin film containing the bis(aminosilyl)alkyl amine compound, injection flow rates of the reaction gas and a carrier gas, pressure, RF power, the temperature of the substrate, and the like. As non-restrictive examples of the deposition conditions, the injection flow rate of the composition for depositing a silicon-containing thin film may be adjusted in a range of 10 to 1000 cc/min, the injection flow rate of the carrier gas may be adjusted in a range of 10 to 1000 cc/min, the injection flow rate of the reaction gas may be adjusted in a range of 1 to 1500 cc/min, the pressure may be adjusted in a range of 0.5 to 10 torr, the RF power may be adjusted in a range of 50 to 1000 W, and the temperature of the substrate may be adjusted in a range of 30 to 500° C., preferably 80 to 300° C., but the deposition conditions are not limited thereto.

The reaction gas used in the method for manufacturing a silicon-containing thin film according to the present invention is not limited, but may be one selected from hydrogen ($H_2$), hydrazine ($N_2H_4$), ozone ($O_3$), oxygen ($O_2$), nitrous oxide ($N_2O$) ammonia ($NH_3$), nitrogen ($N_2$), silane ($SiH_4$), borane ($BH_3$), diborane ($B_2H_6$), and phosphine ($PH_3$), or a mixed gas of one or more thereof, and the carrier gas may be one selected from nitrogen ($N_2$), argon (Ar), and helium (He), or a mixed gas of two or more thereof.

The substrate used in the method for manufacturing a silicon-containing thin film according to the present invention may be a substrate containing one or more semiconductor materials selected from Si, Ge, SiGe, GaP, GaAs, SiC, SiGeC, InAs, and InP; a silicon-on-insulator (SOI) substrate; a quartz substrate; a glass substrate for a display; or a flexible plastic substrate made of polyimide, polyethylene terephthalate (PET), polyethylene naphthalate (PEN), polymethylmethacrylate (PMMA), polycarbonate (PC), polyethersulfone (PES), polyester, and the like, but is not limited thereto.

Further, the silicon-containing thin film may be directly formed on the substrate. Alternatively, a large number of conductive layers, dielectric layers, insulating layers, or the like, may also be formed between the substrate and the silicon-containing thin film.

In addition, the present invention provides a bis(aminosilyl)alkyl amine compound capable of being used as a precursor of a silicon-containing thin film. The bis(aminosilyl)alkyl amine compound according to the present invention is represented by the following Chemical Formula 1.

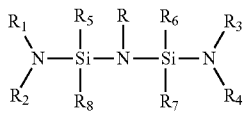

(In Chemical Formula 1, R is (C1-C7)alkyl or (C2-C7)alkenyl; and $R_1$ to $R_4$ are each independently hydrogen, (C1-C7)alkyl, or (C2-C7)alkenyl, or $R_1$ and $R_2$, and $R_3$ and $R_4$ are each independently linked to each other to form a ring; and $R_5$ to $R_8$ are each independently hydrogen, halogen, (C1-C7)alkyl, or (C2-C7)alkenyl.)

The bis(aminosilyl)alkyl amine compound according to the present invention, represented by Chemical Formula 1 is a liquid at room temperature and has high volatility and excellent thermal stability as described above, such that the bis(aminosilyl)alkyl amine compound is used as a significantly useful precursor in forming a silicon-containing thin film.

Further, since in silyl (silicon) of each aminosilyl group, four hydrogen atoms are present, the bis(aminosilyl)alkyl amine compound has excellent reactivity, such that the thin film may be deposited at a rapid deposition rate, and the thin film with a high purity may be manufactured.

Preferably, the bis(aminosilyl)alkyl amine compound represented by Chemical Formula 1 may be represented by Chemical Formula 2, and more preferably Chemical Formula 6 or 7.

The present invention will be described in detail with reference to the following Examples. The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the present invention.

Therefore, configurations described in the embodiments and shown in the drawings of the present specification indicate only the most preferred example rather than indicating all the technical ideas of the present invention and therefore, it is to be understood that various equivalents and modifications that can replace the above configurations may be present.

Further, in all the following Examples, deposition was performed by a plasma enhanced atomic layer deposition (PEALD) method known in the art using a commercialized 200 mm single wafer shower head type ALD apparatus (CN1, Atomic Premium). In addition, deposition was performed by a plasma enhanced chemical vapor deposition (PECVD) method known in the art using a commercialized 200 mm single wafer shower head type CVD (PECVD) apparatus (CN1, Atomic Premium).

A thickness of a deposited silicon-containing thin film was measured using an ellipsometer (OPTI-PROBE 2600, THERMA-WAVE), and properties of the thin film were analyzed using infrared spectroscopy (IFS66V/S & Hyperion 3000, Bruker Optics), X-ray photoelectron spectroscopy, a water vapor transmission rate (WVTR) analyzer (MOCON, Aquatran 2), and a stress analyzer (Frontier Semiconductor, FSM500TC).

[Example 1] Preparation of Bis(methyldimethylaminosilyl)methylamine

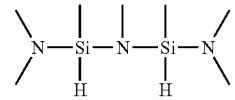

Under an anhydrous and inert atmosphere, after putting dichloromethylsilane ($SiH(CH_3)Cl_2$, 115 g (1.0 mol)) and n-pentane (577 g (8 mol)) into a 1000 mL flame-dried flask and slowly adding methylamine ($CH_3NH_2$, 59 g (1.9 mol)) thereto while maintaining a temperature at $-25°$ C., the mixture was stirred for 3 hours, and methylamine hydrochloride (($CH_3$)$NH_3Cl$) was removed by filtration. While stirring a recovered bis(chloromethylsilyl)methylamine (($SiH(CH_3)Cl$)$_2N(CH_3)$) solution with n-pentane and maintaining a temperature at $-25°$ C., dimethylamine (($CH_3$)$_2NH$, 94 g (7.13 mol)) was slowly added thereto. After the addition was completed, the reaction solution was slowly heated to room temperature and stirred at room temperature for 6 hours. After removing dimethylamine hydrochloride (($CH_3$)$_2NH_2Cl$, white) formed by filtering the resultant, a filtrate was obtained. A solvent was removed from this filtrate under reduced pressure, followed by distillation under reduced pressure, thereby obtaining bis(methyldimethylaminosilyl)methylamine (($CH_3$)$_2NSiH(CH_3$))$_2N(CH_3)$, 71 g (0.35 mol), yield: 70%).

$^1$H-NMR (inCDCl$_3$): δ 0.16 (t, 6H (Si—CH$_3$)$_2$), 2.42 (d, 3H (NCH$_3$)), 2.48 (s, 12H, (($CH_3$)$_2$NSi))$_2$, 4.39 (m, 2H, (—SiHN)$_2$).

[Example 2] Preparation of Bis(ethylmethylaminosilyl)methylamine

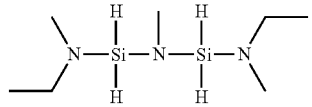

Under an anhydrous and inert atmosphere, after putting dichlorosilane ($SiH_2Cl_2$, 360 g (3.56 mol)) and n-pentane (3,202 g (27.79 mol)) into a 5000 mL flame-dried Sus reactor (a high-pressure reactor) and slowly adding methylamine ($CH_3NH_2$, 210 g (6.77 mol)) thereto while maintaining a temperature at $-25°$ C., the mixture was stirred for 3 hours, and methylamine hydrochloride (($CH_3$)$NH_3Cl$)) was removed by filtration. While stirring a recovered bischlorosilylamine (($SiH_2Cl$)$_2N(CH_3)$) solution with n-pentane and maintaining a temperature at $-25°$ C., ethylmethylamine (($CH_3CH_2$)($CH_3$)NH), 421 g (7.13 mol)) was slowly added thereto. After the addition was completed, the reaction solution was slowly heated to room temperature and stirred at room temperature for 6 hours. After removing ethylmethylamine hydrochloride (($CH_3CH_2$)($CH_3$)$NH_2Cl$), white) formed by filtering the resultant, a filtrate was obtained. A solvent was removed from this filtrate under reduced pressure, followed by distillation under reduced pressure, thereby obtaining bis(ethylmethylaminosilyl)methylamine (($CH_3CH_2$)($CH_3$)$NSiH_2$)$_2N(CH_3)$, 219 g (1.07 mol), yield: 60%).

$^1$H-NMR (inC6D6): δ 0.97 (t, 6H (N—CH$_2$—CH$_3$)$_2$), 2.47 (s, 6H (Si—NCH$_3$)$_2$), 2.53 (s, 3H (SiH$_2$—NCH$_3$)), 2.81 (q, 4H (N—CH$_2$—CH$_3$)$_2$, 4.77 (m, 4H, (—SiH$_2$N)$_2$).

[Example 3] Manufacturing of Silicon Oxide Thin Film by PEALD Using Bis(ethylmethylaminosilyl)methylamine Film was formed using the bis(ethylmethylaminosilyl) methyl amine compound prepared in Example 2 according to the present invention as a composition for forming a silicon oxide film in a general plasma enhanced atomic layer deposition (PEALD) apparatus using a plasma enhanced atomic layer deposition (PEALD) method known in the art.

As a reaction gas, nitrous oxide was used together with plasma, and nitrogen corresponding to an inert gas was used for purging. The film was formed at reaction gas and plasma time of 0.5 seconds. A specific method for depositing a silicon oxide thin film was illustrated in Table 1.

A result obtained by analyzing the manufactured silicon oxide thin film was illustrated in Table 2, and a result obtained by analyzing the deposited film using infrared spectroscopy was illustrated in FIG. 3.

[Examples 4 and 5] Manufacturing of Silicon Oxide Thin Film by PEALD Using Bis(ethylmethylaminosilyl)methylamine Silicon oxide thin films were manufactured in the same manner as in Example 3 except for changing deposition conditions illustrated in the following Table 1 in Example 3, results obtained by analyzing the manufactured silicon oxide thin film were illustrated in the following Table 2, and results obtained by analyzing the deposited film using the infrared spectroscopy were illustrated in FIG. 3.

[Example 6] Manufacturing of Silicon Nitride Thin Film by PEALD Using Bis(ethylmethylaminosilyl)methylamine Film was formed using the bis(ethylmethylaminosilyl) methyl amine compound prepared in Example 2 according to the present invention as a composition for forming a silicon nitride film in a general plasma enhanced atomic layer deposition (PEALD) apparatus using a plasma enhanced atomic layer deposition (PEALD) method known in the art. As a reaction gas, nitrogen and ammonia were used together with plasma as first reaction gas, and nitrogen was used as a second reaction gas. The nitrogen corresponding to an inert gas was used for purging. A specific method for depositing a silicon nitride thin film was illustrated in Table 3.

A specific result obtained by analyzing the silicon nitride thin film was illustrated in Table 4, and a result obtained by analyzing the deposited film using an infrared spectrometer were illustrated in FIG. 4.

[Examples 7 to 9] Manufacturing of Silicon Nitride Thin Film by PEALD Using Bis(ethylmethylaminosilyl)methylamine Silicon nitride thin films were manufactured in the same manner as in Example 6 except for changing conditions illustrated in the following Table 3 in Example 6, results obtained by analyzing the manufactured silicon oxide thin film were illustrated in the following Table 4, and results obtained by analyzing the deposited film using the infrared spectrometer were illustrated in FIG. 4.

TABLE 1

Deposition Conditions of Silicon Oxide Thin Film by PEALD

| | Temperature | Precursor | | Purge | | Reaction Gas and Plasma | | Reaction Gas Purge | | No. of Deposition | | |
| --- | --- | --- | --- | --- | --- | --- | --- | --- | --- | --- | --- | --- |
| | of Substrate (° C.) | Heating Temperature (° C.) | Injection Time (sec) | Flow Rate (sccm) | Time (sec) | Flow Rate (sccm) | RF Power (W) | Time (sec) | Time (sec) | Flow Rate (sccm) | Cycle | Process Time (sec) |
| Example 3 | 90 | 65 | 0.1 | 600 | 0.4 | 800 | 400 | 0.5 | 0.1 | 300 | 614 | 675 |
| Example 4 | 90 | 65 | 0.1 | 600 | 0.4 | 800 | 400 | 0.7 | 0.1 | 300 | 603 | 784 |
| Example 5 | 90 | 65 | 0.1 | 600 | 0.4 | 800 | 400 | 0.9 | 0.1 | 300 | 603 | 905 |

TABLE 2

Evaluation of Properties of Silicon Oxide Thin Film

| | Deposition Rate (Å/cycle) | Thickness of Thin Film (Å) | Refractive Index | O/Si Composition Ratio | Stress of Film (MPa) | WVTR (g/[m$^2$-day]) |
| --- | --- | --- | --- | --- | --- | --- |
| Example 3 | 1.14 | 700 | 1.46 | 1.72 | −201 | 3.2E−02 |
| Example 4 | 1.16 | 700 | 1.47 | 1.72 | −231 | 1.5E−02 |
| Example 5 | 1.16 | 700 | 1.47 | 1.72 | −275 | 3.5E−03 |

TABLE 3

Deposition Conditions of Silicon Nitride Thin Film by PEALD

| | Temperature | Precursor | | Purge | | Reaction Gas and Plasma | | | | Reaction Gas Purge | | No. of | |
|---|---|---|---|---|---|---|---|---|---|---|---|---|---|
| | of Substrate (° C.) | Heating Temperature (° C.) | Injection Time (sec) | Flow Rate (sccm) | Time (sec) | Flow Rate (sccm) | RF Power (W) | Time (sec) | Flow Rate (sccm) | RF Power (W) | Time (sec) | Time (sec) | Flow Rate (sccm) | Deposition Cycle | Process Time (sec) |
| Example 6 | 300 | 65 | 0.4 | 6000 | 0.4 | 2000 | 100 | 1.5 | 6000 | 600 | 4 | 0.4 | 6000 | 300 | 2130 |
| Example 7 | 300 | 65 | 0.4 | 6000 | 0.4 | 2000 | 200 | 1.5 | 6000 | 600 | 4 | 0.4 | 6000 | 300 | 2130 |
| Example 8 | 300 | 65 | 0.4 | 6000 | 0.4 | 2000 | 400 | 1.5 | 6000 | 600 | 4 | 0.4 | 6000 | 300 | 2130 |
| Example 9 | 300 | 65 | 0.4 | 6000 | 0.4 | 2000 | 800 | 1.5 | 6000 | 600 | 4 | 0.4 | 6000 | 300 | 2130 |

TABLE 4

Evaluation of Properties of Silicon Nitride Thin Film

| | Variable | Deposition Rate (Å/cycle) | Thickness of Thin Film (Å) | Refractive Index — | N/Si Composition Ratio | Stress of Film (MPa) | WVTR (g/[m²-day]) |
|---|---|---|---|---|---|---|---|
| Example 6 | Plasma Power of 100 W | 0.29 | 88 | 1.93 | 1.13 | −301 | 6.2E−02 |
| Example 7 | Plasma Power of 200 W | 0.22 | 67 | 1.89 | 1.16 | −350 | 1.1E−02 |
| Example 8 | Plasma Power of 400 W | 0.34 | 103 | 1.95 | 1.18 | −416 | 3.5E−03 |
| Example 9 | Plasma Power of 800 W | 0.38 | 114 | 1.80 | 1.21 | −517 | 5.3E−03 |

The invention claimed is:

1. A composition for depositing a silicon-containing thin film, the composition comprising a bis(aminosilyl)alkylamine compound represented by the following Chemical Formula 1 is represented by the following Chemical Formula 4 or 5:

[Chemical Formula 1]

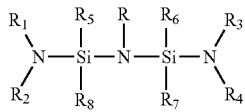

in Chemical Formula 1,

R is C1-C7 alkyl or C2-C7 alkenyl;

$R_1$ to $R_4$ are each independently hydrogen, C1-C7 alkyl, or C2-C7 alkenyl, or $R_1$ and $R_2$, and $R_3$ and $R_4$ are each independently linked to each other to form a ring; and $R_5$ to $R_8$ are each independently hydrogen, halogen, C1-C7 alkyl, or C2-C7 alkenyl;

[Chemical Formula 4]

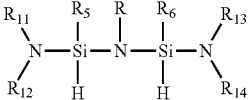

[Chemical Formula 5]

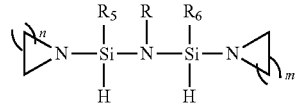

in Chemical Formulas 4 and 5,

R is C1-C7 alkyl or C2-C7 alkenyl;

$R_{11}$ to $R_{14}$ are each independently hydrogen, C1-C7 alkyl, or C2-C7 alkenyl;

$R_5$ and $R_6$ are each independently C1-C7 alkyl, or C2-C7 alkenyl; and n and m are each independently an integer of 1 to 7.

2. The composition of claim 1, wherein in Chemical Formulas 4 and 5,

R is C1-C5 alkyl;

$R_5$ and $R_6$ are each independently C1-C5alkyl; and n and m are each independently an integer of 1 to 4.

3. The composition of claim 1, wherein the bis(aminosilyl)alkylamine compound is selected from the following compounds:

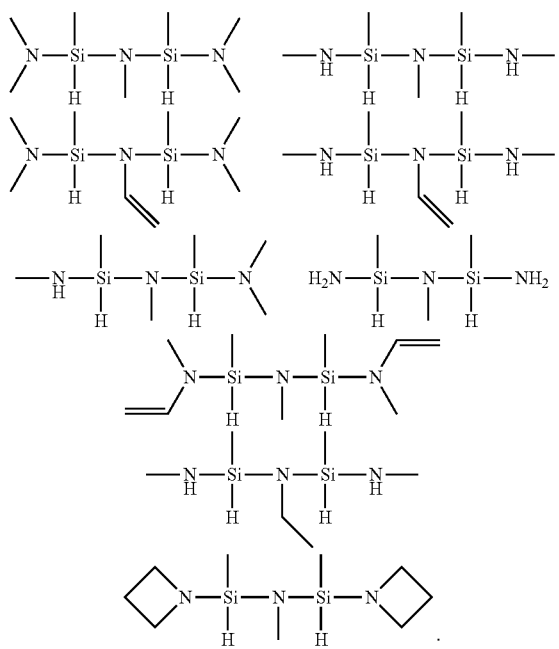

4. A method for manufacturing a silicon-containing thin film, using a composition for depositing the silicon-containing thin film, wherein the method comprises a) maintaining a temperature of a substrate mounted in a chamber at 30° C. to 500° C.; b) contacting the composition with the substrate to adsorb the composition in the substrate; and c) injecting a reaction gas into the substrate in which the composition is adsorbed to the silicon-containing thin film;
wherein the composition comprising a bis(aminosilyl) alkylamine compound represented by the following Chemical Formula 1:

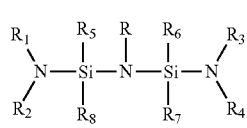

[Chemical Formula 1]

in Chemical Formula 1,
R is C1-C7 alkyl or C2-C7 alkenyl;
$R_1$ to $R_4$ are each independently hydrogen, C1-C7 alkyl, or C2-C7 alkenyl, or $R_1$ and $R_2$, and $R_3$ and $R_4$ are each independently linked to each other to form a ring; and
$R_5$ to $R_8$ are each independently hydrogen, halogen, C1-C7 alkyl, or C2-C7 alkenyl.

5. The method of claim 4, wherein deposition is performed by an atomic layer deposition method, a chemical vapor deposition method, a metal-organic chemical vapor deposition method, a low-pressure chemical vapor deposition method, a plasma-enhanced chemical vapor deposition method, or a plasma-enhanced atomic layer deposition method.

6. The method of claim 4, wherein the silicon-containing thin film is a silicon oxide film, a silicon oxy carbide film, a silicon nitride film, a silicon oxy nitride film, a silicon carbonitride film, or a silicon carbide film.

7. The method of claim 4, wherein the reaction gas is supplied after being activated by generating plasma with a plasma power of 50 to 1000 W.

8. The method of claim 4, wherein in Chemical Formula 1, $R_5$ to $R_7$ are each independently hydrogen, halogen, C1-C7 alkyl, or C2-C7 alkenyl, and $R_8$ is hydrogen.

9. The method of claim 4, wherein the bis(aminosilyl) alkylamine compound represented by Chemical Formula 1 is represented by the following Chemical Formula 2 or 3:

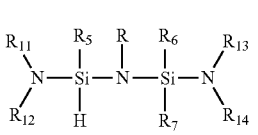

[Chemical Formula 2]

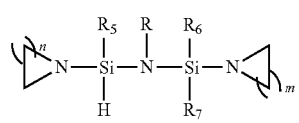

[Chemical Formula 3]

in Chemical Formula 2 or 3,
R is C1-C7 alkyl or C2-C7 alkenyl;
$R_5$ to $R_7$ are each independently hydrogen, halogen, C1-C7 alkyl, or C2-C7-alkenyl;
$R_{11}$ to $R_{14}$ are each independently hydrogen, C1-C5 alkyl, or C2-C5 alkenyl; and
n and m are each independently an integer of 1 to 7.

10. The method of claim 9, wherein in Chemical Formula 2 or 3, $R_5$ to $R_7$ are each independently hydrogen or C1-C7 alkyl;
$R_{11}$ to $R_{14}$ are each independently hydrogen, C1-C5 alkyl, or C2-C5 alkenyl; and
n and m are each independently an integer of 1 to 4.

11. The method of claim 4, wherein the bis(aminosilyl) alkylamine compound represented by Chemical Formula 1 is represented by the following Chemical Formula 4 or 5:

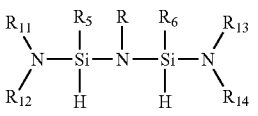

[Chemical Formula 4]

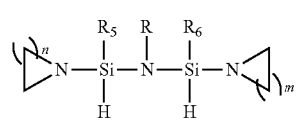

[Chemical Formula 5]

in Chemical Formulas 4 and 5,
R is C1-C7 alkyl or C2-C7 alkenyl;
$R_{11}$ to $R_{14}$ are each independently hydrogen, C1-C7 alkyl, or C2-C7 alkenyl;
$R_5$ and $R_6$ are each independently C1-C7 alkyl or C2-C7 alkenyl; and
n and m are each independently an integer of 1 to 7.

12. The method of claim 4, wherein the bis(aminosilyl) alkylamine compound represented by following Chemical Formula 1 is selected from the following compounds:

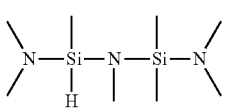 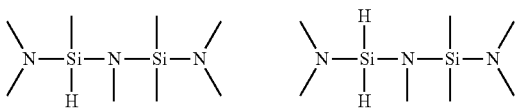

-continued

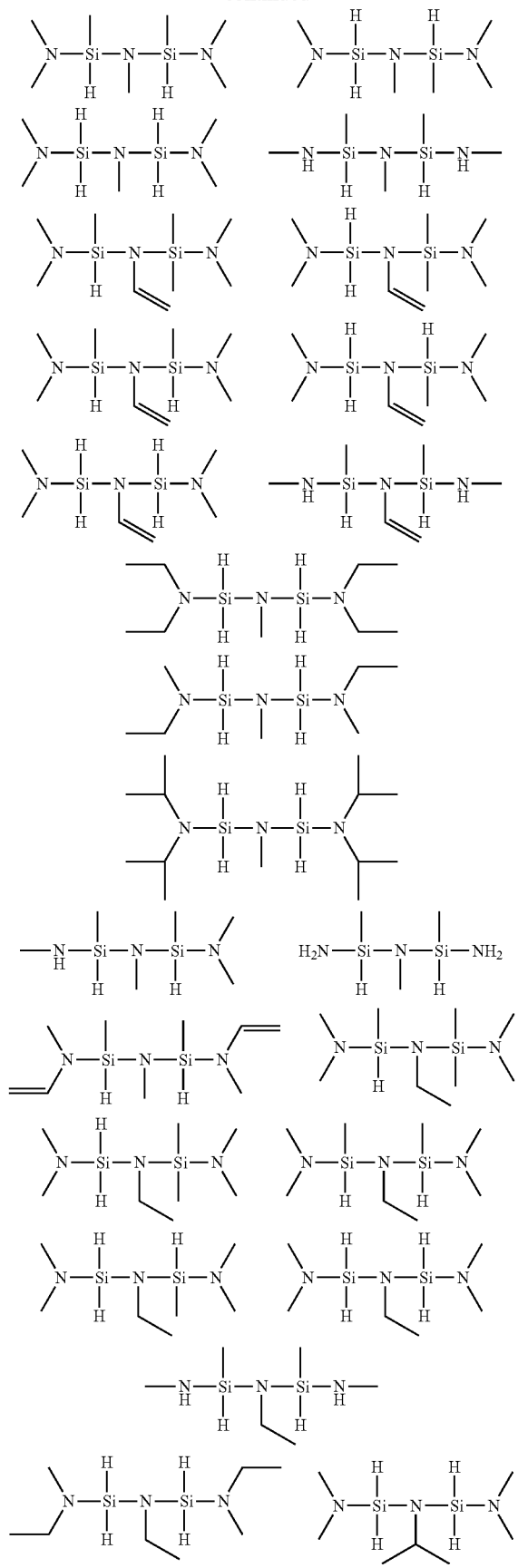

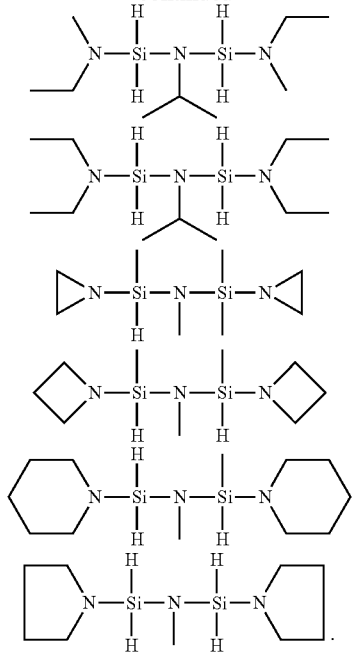

13. A bis(aminosilyl)alkylamine compound represented by the following Chemical Formula 1:

[Chemical Formula 1]

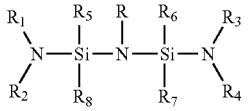

in Chemical Formula 1,
R is C1-C7 alkyl or C2-C7 alkenyl;
$R_1$ to $R_4$ are each independently hydrogen, C1-C7 alkyl, or C2-C7 alkenyl, or $R_1$ and $R_2$, and $R_3$ and $R_4$ are each independently linked to each other to form a ring;
$R_5$ and $R_6$ are each independent C1-C7 alkyl or C2-C7 alkenyl; and
$R_7$ and $R_8$ are each hydrogen.

14. The bis(aminosilyl)alkylamine compound of claim 13, wherein the bis(aminosilyl)alkylamine compound represented by Chemical Formula 1 is represented by Chemical Formula 2 or 3:

[Chemical Formula 2]

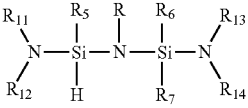

[Chemical Formula 3]

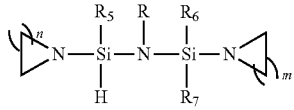

In Chemical Formula 2 or 3,
R is C1-C7 alkyl or C2-C7 alkenyl;
$R_5$ and $R_6$ are each independent C1-C7 alkyl or C2-C7 alkenyl; and $R_7$ is each hydrogen;

$R_{11}$ to $R_{14}$ are each independently hydrogen, C1-C5 alkyl, or C2-C5 alkenyl; and n and m are each independently an integer of 1 to 7.

\* \* \* \* \*